United States Patent
Kim et al.

(10) Patent No.: US 7,473,961 B2
(45) Date of Patent: Jan. 6, 2009

(54) NON-VOLATILE MEMORY DEVICE AND METHOD OF FABRICATING THE SAME

(75) Inventors: Ki-chul Kim, Suwon-si (KR); Geum-jong Bae, Incheon Metropolitan (KR); In-wook Cho, Yongin-si (KR); Byoung-jin Lee, Seoul (KR); Jin-hee Kim, Seongnam-si (KR); Sang-su Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 111 days.

(21) Appl. No.: 11/183,614

(22) Filed: Jul. 18, 2005

(65) Prior Publication Data

US 2006/0033152 A1 Feb. 16, 2006

(30) Foreign Application Priority Data

Aug. 14, 2004 (KR) ............... 10-2004-0064097

(51) Int. Cl.
*H01L 29/792* (2006.01)
(52) U.S. Cl. ............ 257/321; 257/324; 257/E29.309
(58) Field of Classification Search ............ None
See application file for complete search history.

(56) References Cited

U.S. PATENT DOCUMENTS

| | | | | |
|---|---|---|---|---|
| 5,994,734 A | 11/1999 | Chou | ................ | 257/316 |
| 6,335,554 B1 * | 1/2002 | Yoshikawa | ................ | 257/316 |
| 6,632,714 B2 | 10/2003 | Yoshikawa | ................ | 438/258 |
| 2002/0163032 A1 * | 11/2002 | Lin et al. | ................ | 257/315 |
| 2003/0042527 A1 * | 3/2003 | Forbes et al. | ................ | 257/315 |
| 2004/0136240 A1 | 7/2004 | Zheng et al. | ............ | 365/185.29 |
| 2004/0251489 A1 * | 12/2004 | Jeon et al. | ................ | 257/315 |
| 2004/0266109 A1 * | 12/2004 | Ogura et al. | ................ | 438/260 |

FOREIGN PATENT DOCUMENTS

| | | |
|---|---|---|
| JP | 2000-232172 | 8/2000 |
| KR | 10-2004-0033406 | 4/2004 |

* cited by examiner

*Primary Examiner*—Evan Pert
*Assistant Examiner*—Ben P Sandvik
(74) *Attorney, Agent, or Firm*—Mills & Onello, LLP

(57) ABSTRACT

A non-volatile memory device having improved electrical characteristics and a method of fabricating the non-volatile memory device are provided. The non-volatile memory device includes a gate electrode, which is formed on a semiconductor substrate on which source and drain regions are formed, a trapping structure, which is interposed between the semiconductor substrate and the gate electrode and comprises an electron tunneling layer and a charge trapping layer, and an electron back-tunneling prevention layer, which is interposed between the gate electrode and the charge trapping layer, prevents electrons in the gate electrode from back-tunneling through the charge trapping layer, and is formed of a metal having a higher work function than the gate electrode.

35 Claims, 6 Drawing Sheets

NON-VOLATILE MEMORY DEVICE AND METHOD OF FABRICATING THE SAME

This application claims priority from Korean Patent Application No. 10-2004-0064097 filed on Aug. 14, 2004 in the Korean Intellectual Property Office, the contents of which are incorporated herein by reference in their entirety.

BACKGROUND OF THE INVENTION

1. Field of the Invention

The present invention relates to a non-volatile memory device, and more particularly, to a non-volatile memory device which has improved electrical characteristics, and a method of fabricating the non-volatile memory device.

2. Description of the Related Art

Floating gate-type non-volatile memory devices are widely used in various industrial fields. In response to a strong demand for miniaturized floating gate-type non-volatile memory devices, non-volatile memory devices having a high integration density have been rapidly developed. However, there is a clear limit to which floating gate-type non-volatile memory devices can be miniaturized because a high voltage is always required for programming or erasure, and if the floating gate-type non-volatile memory device is excessively miniaturized, it may be difficult or even impossible to secure sufficient margins during the manufacture of the floating gate-type non-volatile memory device.

Therefore, research has been vigorously carried out on various alternatives to the floating gate-type non-volatile memory device. In particular, polysilicon-oxide-nitride-tunnel-thin oxide-semiconductor (SONOS) non-volatile memory devices have drawn much interest as a next generation device that will replace the floating gate-type non-volatile memory device.

Recently, a stack-type SONOS non-volatile memory device in which a thin oxide layer, which serves as a tunneling layer, a silicon nitride layer, which serves as a charge trapping layer, and an oxide layer, which serves as an electron shield layer, are sequentially stacked, has been widely used. More recently, a local type SONOS non-volatile memory device in which an ONO structure is formed to be only a part of a gate has been developed.

While the local type SONOS non-volatile memory device can be efficiently programmed and erased, it is difficult to control the length of the ONO structure because, the ONO structure is formed and then the gate is formed. In addition, if the local type SONOS non-volatile memory device is miniaturized, the characteristics of the local type SONOS non-volatile memory device may degrade due to variation in the length of the ONO structure.

SUMMARY OF THE INVENTION

The present invention provides a non-volatile memory device that can be efficiently programmed or erased by controlling the length of an ONO structure therein, and a method of fabricating the non-volatile memory device.

The present invention also provides a non-volatile memory device that can prevent electrons from back-tunneling from a sub-gate to an electron shield layer when data is erased therefrom, and a method of fabricating the non-volatile memory device.

According to an aspect of the present invention, there is provided a non-volatile memory device including a gate electrode, which is formed on a semiconductor substrate on which source and drain regions are formed, a trapping structure, which is interposed between the semiconductor substrate and the gate electrode and comprises an electron tunneling layer and a charge trapping layer, and an electron back-tunneling prevention layer, which is interposed between the gate electrode and the charge trapping layer, prevents electrons in the gate electrode from back-tunneling through the charge trapping layer, and is formed of a metal having a higher work function than the gate electrode.

According to another aspect of the present invention, there is provided a non-volatile memory device including a gate insulation layer, which is formed on a semiconductor substrate on which source and drain regions are formed, a main gate electrode, which is formed on the gate insulation layer, a sub gate electrode, which is formed on sidewalls of the main gate electrode, a trapping structure, which is interposed between the sub gate electrode and the semiconductor substrate and comprises an electron tunneling layer and a charge trapping layer, and an electron back-tunneling prevention layer, which is interposed between the gate electrode and the charge trapping layer, prevents electrons in the sub gate electrode from back-tunneling through the charge trapping layer, and is formed of a metal having a higher work function than the sub gate electrode.

According to still another aspect of the present invention, there is provided a non-volatile memory device including a trapping structure, which is formed on a semiconductor substrate on which source and drain regions are formed and comprises an electron tunneling layer and a charge trapping layer, and a gate electrode, which is formed on the trapping structure and is formed of a metal preventing electrons injected thereinto from back-tunneling through the charge trapping layer.

According to yet another aspect of the present invention, there is provided a non-volatile memory device including a gate insulation layer, which is formed on a semiconductor substrate where source and drain regions are formed, a main gate electrode, which is formed on the gate insulation layer, a trapping structure, which is formed on sidewalls of the main gate electrode and comprises an electron tunneling layer and a charge trapping layer, and a sub gate electrode formed on the trapping structure, wherein the sub gate electrode is formed of metal that prevents electrons therein from back-tunneling to the charge trapping layer.

According to a further aspect of the present invention, there is provided a method of fabricating a non-volatile memory device comprising forming an electron tunneling layer and a charge trapping layer on the surface of a semiconductor substrate, forming an electron back-tunneling prevention layer of a metal having a higher work function than a gate electrode, the electron back-tunneling prevention layer preventing electrons in the gate electrode from back-tunneling to the charge trapping layer, and forming the gate electrode on the metal trapping layer.

According to another aspect of the present invention, there is provided a method of fabricating a non-volatile memory device comprising forming a gate insulation layer in an active region on a semiconductor substrate and forming a main gate electrode on the gate insulation layer, forming an electron tunneling layer and a charge trapping layer on the surface of the semiconductor substrate, forming an electron tunneling prevention layer of a metal having a higher work function than a sub gate electrode, the electron tunneling prevention layer preventing electrons in the sub gate electrode from back-tunneling to the charge trapping layer, forming the sub gate electrode on sidewalls of the main gate electrode and on the electron tunneling prevention layer, and etching portions of the electron tunneling layer, the charge trapping layer, and the electron tunneling prevention layer that are formed on the main gate electrode and outside the sub gate electrode using the sub gate electrode as an etching mask.

According to still another aspect of the present invention, there is provided a method of fabricating a non-volatile memory device including forming an electron tunneling layer and a charge trapping layer on the surface of a semiconductor substrate, and forming a gate electrode of a metal on the charge trapping layer so that electrons in the gate electrode are prevented from back-tunneling to the charge trapping layer.

According to yet another aspect of the present invention, there is provided a method of fabricating a non-volatile memory device including forming a gate insulation layer and a main gate electrode in an active region on a semiconductor substrate, forming an electron tunneling layer and a charge trapping layer on the surface of the semiconductor substrate, forming a sub gate electrode of a metal on sidewalls of the main gate electrode so that electrons in the sub gate electrode are be prevented from back-tunneling to the charge trapping layer, and etching the electron tunneling layer and the charge trapping layer on the main gate electrode and outside the sub gate electrode using the sub gate electrode as an etching mask.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity. In addition, when a layer is described as being formed on another layer or on a substrate, the layer may be formed on the other layer or on the substrate, or a third layer may be interposed between the layer and the other layer or the substrate.

DETAILED DESCRIPTION OF THE INVENTION

Figure 1:
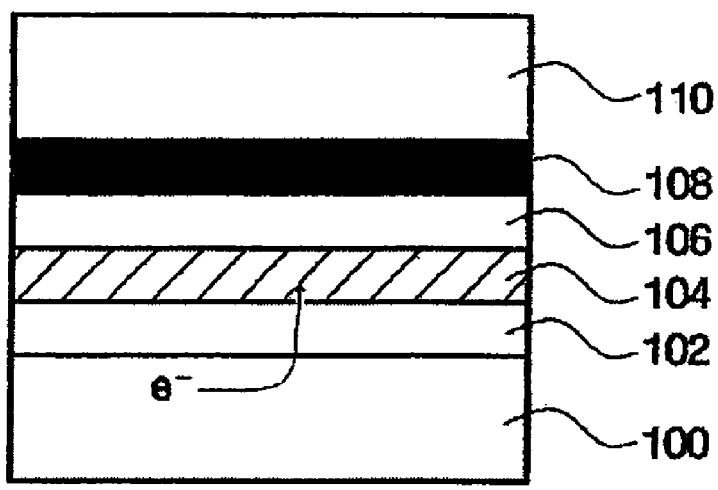
FIG. 1 is a cross-sectional view of a structure in which an ONO structure and a metallic structure, which serve as an electron back-tunneling prevention layer, are stacked.
Figure 2:
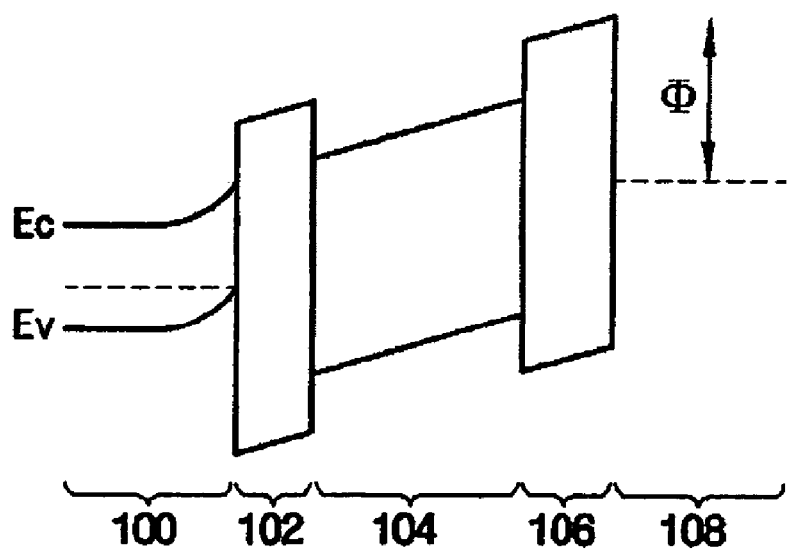
FIG. 2 is a diagram illustrating an energy band of the electron back-tunneling prevention layer of FIG. 1.

FIG. 1 is a cross-sectional view of a structure in which an ONO structure and a metallic structure, which serve as an electron back-tunneling prevention layer, are stacked, and FIG. 2 is a diagram illustrating an energy band of the electron back-tunneling prevention layer of FIG. 1.

Referring first to FIG. 1, an oxide layer 102, a nitride layer 104, an oxide layer 106, a metallic structure 108, and a gate electrode 110 are sequentially stacked on a silicon substrate 100.

Here, the oxide layer 102 serves as an electron tunneling layer, the nitride layer 104 serves as a charge trapping layer, the oxide layer 106 serves as an electron shield layer, and the metallic structure 108 serves as an electron back-tunneling prevention layer.

As shown in FIG. 1, the metallic structure 108 is disposed between the gate electrode 110 and the oxide layer 106 and is a metallic layer having a higher work function than the material of the gate electrode 110. On the other hand, the metallic structure 108 may also be a metallic gate electrode, in which case, the gate electrode 110 is preferably, but not necessarily, formed of a metal having a higher work function than polysilicon, the material of a conventional gate electrode.

Specifically, if a metallic layer having a higher work function than the gate electrode 110 or a metallic gate electrode having a higher work function than polysilicon is formed on the oxide layer 106, an energy barrier formed between the metallic structure 108 and the oxide layer 106 becomes higher than an energy barrier formed between an oxide layer and a polysilicon gate electrode in the prior art, which will be described below with reference to FIG. 2.

Referring to FIG. 2, $\Phi$ denotes an energy barrier formed between the metallic structure 108 and the oxide layer 106. As described above, if the energy barrier $\Phi$ becomes higher than an energy barrier formed between an oxide layer and a polysilicon gate electrode in the prior art, back-tunneling of electrons from the gate electrode 110 to the nitride layer 104 through the oxide layer 106 is relatively reduced compared to the prior art.

Accordingly, the probability of electrons in the gate electrode 110 tunneling through the oxide layer 106 to reach the nitride layer 104 decreases. This is also applicable to an erase operation of a non-volatile memory device, which is enabled by applying a negative voltage and a positive voltage to a gate electrode and a substrate, respectively.

Therefore, during an erase operation of a non-volatile memory device, back-tunneling of electrons from the gate electrode 110 to the nitride layer 104 is prevented, thus enhancing the erase operation speed of the non-volatile memory device.

The oxide layer 102, which serves as an electron tunnelling layer, may be replaced with a nitride layer, a nitrogen oxide layer, a high dielectric material layer, or any combination thereof in order to further enhance the program efficiency of the non-volatile memory device. In particular, the oxide layer 102 may be formed of a high dielectric material, such as aluminium oxide, zirconium oxide, hafnium oxide, or lanthanum oxide.

The oxide layer 106, which serves as an electron shield layer, may be comprised of a stack of thermal oxide and a middle temperature oxide (MTO) that are annealed in an $N_2O$ atmosphere or a stack of SiON, MTO, SiON, and MTO that are annealed in an $N_2O$ atmosphere. In addition, the oxide layer 106 may be composed of a high dielectric material, such as aluminium oxide, zirconium oxide, hafnium oxide, lanthanum oxide, or any combination thereof.

The nitride layer 104 may be replaced with a material layer composed of a high dielectric material, such as aluminium oxide, zirconium oxide, hafnium oxide, lanthanum oxide, nitride oxide, silicon dioxide, or any combination thereof. If the nitride layer 104 is replaced with a material layer composed of aluminium oxide, zirconium oxide, hafnium, lanthanum oxide, nitride oxide, silicon dioxide, or any combination thereof, nitrogen may be added to the material layer.

In addition, the nitride layer 104 may also be replaced with a composite layer in which a nitride layer and a material layer selected among high dielectric materials including aluminium oxide, zirconium oxide, hafnium, lanthanum oxide, nitride oxide, silicon dioxide, and a combination thereof, are stacked regardless of the order in which they are stacked, or may also be replaced with a composite layer in which at least two pairs of the nitride layer and the material layer are stacked.

The nitride layer 104 may also be replaced with a layer formed by stacking nitride and one of aluminium oxide, zirconium oxide, hafnium, lanthanum oxide, nitrogen oxide, and silicon dioxide in a sandwich form.

In addition, the nitride layer 104 may also be composed of nitride dots, silicon dots, nano-crystal dots, metal nano-dots, or any combination thereof.

The metallic layer 108 may be formed of any metal having a higher work function than the material of the gate electrode 110. Preferably, but not necessarily, the metallic layer 108 is formed of a metal having a higher work function than polysilicon, such as TaN, NiTa, Ti, TiN, Ta, W, WN, Hf, Nb, Mo, $RuO_2$, $Mo_2N$, Ir, Pt, Co, Cr, RuO, or WNx.

As described above, the metallic layer 108, which serves as an electron back-tunneling prevention layer, is formed on a stack of the oxide layer 102, the nitride layer 104, and the oxide layer 106. This structure illustrated in FIG. 1 may be applied to self-aligned SONOS non-volatile memory devices as well as floating gate-type or local type SONOS non-volatile memory devices.

Figure 3:
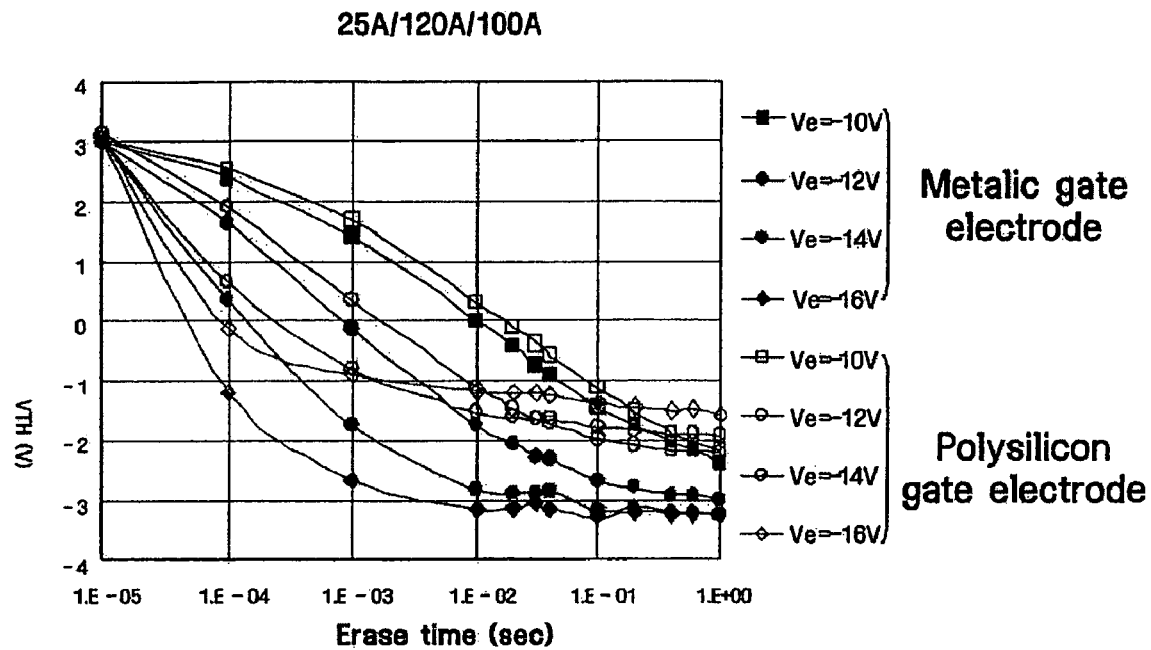
FIG. 3 is a graph showing the erase characteristics of a non-volatile memory device having the structure of FIG. 1.

FIG. 3 is a graph comparing the erase characteristics of a non-volatile memory device having the structure of FIG. 1.

In the non-volatile memory device, a metallic structure (108 of FIG. 1) is formed of TaN, which is a material having a higher work function than polysilicon, on an oxide layer (106 of FIG. 1) that serves as an electron shield layer so that it is interposed between the oxide layer and a gate electrode (110 of FIG. 1) formed of polysilicon. The gate electrode, the oxide layer, and the metallic structure are formed to thicknesses of 25 Å, 120 Å, and 100 Å, respectively.

Referring to FIG. 3, the vertical axis represents a critical voltage $V_{th}$, and the horizontal axis represents erase time (sec). FIG. 3 presents a plurality of curves. The curves marked with solid shapes represent the erase characteristics of a non-volatile memory device in which the metallic structure (108 of FIG. 1) is interposed between an oxide layer (106 of FIG. 1) and a gate electrode formed of polysilicon, and the curves marked with hollow shapes represent the erase characteristics of a non-volatile memory device in which no metallic structure is interposed between the oxide layer and the gate electrode formed of polysilicon.

What each of the curves represent is described in detail in a key on the right side of the graph of FIG. 3.

As described above, the speed (hereinafter referred to as erase speed) of erasing data from a non-volatile memory device according to an exemplary embodiment of the present invention, in which a metallic structure is formed between an oxide layer and a polysilicon gate electrode, is higher than the erase speed of a conventional non-volatile memory device in which no metallic structure is formed between an oxide layer and a polysilicon gate electrode.

In addition, data is erased from the non-volatile memory device according to the exemplary embodiment of the present invention with a lower critical voltage $V_{th}$ than from the conventional non-volatile memory device.

The higher the erase speed of a non-volatile memory device, the better the performance of the non-volatile memory device. In addition, the higher the erase speed of the non-volatile memory device, the lower the voltage required for erasing data from the non-volatile memory device. Thus, it is possible to reduce stress that an erase operation imposes on the non-volatile memory device and eventually enhance the reliability of the non-volatile memory device by improving the erase speed of the non-volatile memory device.

A non-volatile memory device according to an exemplary embodiment of the present invention will be described below more fully with reference to FIG. 4.

Figure 4:
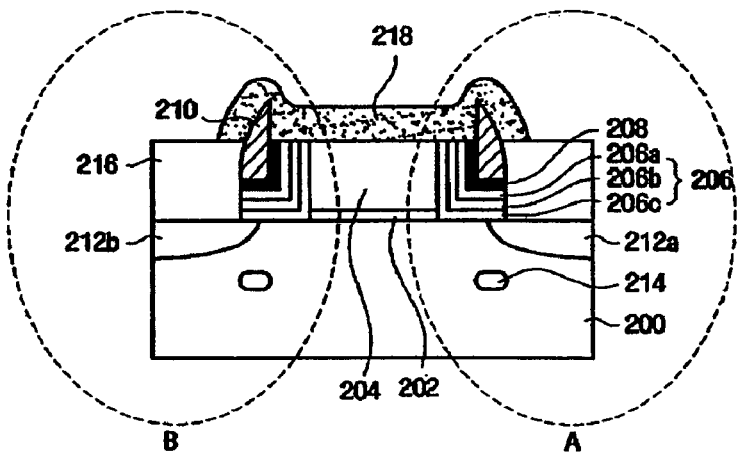
FIG. 4 is a cross-sectional view of a non-volatile memory device according to an exemplary embodiment of the present invention.

FIG. 4 is a cross-sectional view of a non-volatile memory device according to an exemplary embodiment of the present invention.

Referring to FIG. 4, source and drain regions 212a and 212b are formed in an active region defined on a semiconductor substrate 200 through an isolation operation, such as a shallow trench isolation (STI) operation.

Halo ion-implanted regions 214 are formed in the semiconductor substrate 200. A main gate electrode 204 is formed through patterning on the semiconductor substrate 200. A gate insulation layer 202 is interposed between the semiconductor substrate 200 and the main gate electrode 204. An oxide layer 206c, a nitride layer 206b, an oxide layer 206a, and a metallic layer 208 are formed at sidewalls of the main gate electrode 204 in an 'L' shape.

Here, the oxide layer 206c serves as an electron tunnelling layer, the nitride layer 206b serves as a charge trapping layer, the oxide layer 206a serves as an electron shield layer, and the metallic layer 208 serves as an electron tunnelling prevention layer.

A sub gate electrode 210 acting as a spacer is formed of a material such as polysilicon on the metallic layer 208.

An interlayer dielectric (ILD) layer 216 is formed on the entire surface of the semiconductor substrate 200 with the exception of portions of the semiconductor substrate 200 on which the main gate electrode 204, the sub gate electrode 210, the ONO structure 206, and the metallic layer 208 are formed.

As a result, the top surface of the main gate electrode 204 is exposed, and an upper portion of the sub gate electrode 210 protrudes. Thereafter, a conductive layer 218 is formed on the resulting structure. The conductive layer 218 is a metal wiring layer that electrically connects the top surface of the main gate electrode 204 and the upper portion of the sub gate electrode 210.

As described above, the oxide layer 206c, the nitride layer 206b, and the oxide layer 206, which are deposited on the sidewalls of the main gate electrode 204 in an 'L' shape, serve as an electron tunnelling layer, a charge trapping layer, and an electron shield layer, respectively.

In addition, as described above, the metallic layer 208 is formed of a metal having a higher work function than polysilicon, which is the material of the sub gate electrode 210.

Program, read, and erase operations of the non-volatile memory device of FIG. 4 will be described below, assuming that the non-volatile memory device is an N-type metal oxide semiconductor (NMOS) device for the convenience of explanation. However, it will be understood by those of skill in the art that the following description of the program, read, erase operations of the non-volatile memory device is also applicable to a P-type metal oxide semiconductor (PMOS) device.

In addition, the program, read, erase operations of the non-volatile memory device will be described below, mainly focusing on a case in which they are performed in an area A on the left side of the main gate electrode 204. However, it will be understood by those of skill in the art that the following description of the program, read, erase, operations of the non-volatile memory device is applicable to an area B on the right side of the main gate electrode 204.

A program operation is performed through hot electron injection (HEI). Specifically, a high voltage (e.g., a voltage of 5-8 V) is applied to the conductive layer 218 so that the same voltage is applied to the main gate electrode 204 and to the sub gate electrode 210. Thereafter, the source and drain regions 212b in the area B are grounded, and a high voltage (e.g., a voltage of 5-8 V) is applied to the source and drain regions 212a.

As a result, an inversion region and a depletion region are formed in a channel area. Many electrons in the inversion region exist as carriers. Even if the voltage applied to the source and drain regions 212a in the area A increases, the inversion region in the channel area pinches off and fails to encroach upon the source and drain regions 212a, so that a depletion region is formed between the inversion region and the source and drain regions 212a in the area A.

Electrons in a portion of the depletion region close to the source and drain regions 212a are injected into the nitride layer 206b after tunnelling through the oxide layer 206c. The electrons injected into the nitride layer 206b form an electron trap area (not shown) in the nitride layer 206b. Then, the entire program operation is completed. The electron trap area in the nitride layer 206b varies the electric potential of the channel area.

The variation in the electric potential of the channel serves as a basis for determination of the type of data stored in the non-volatile memory device during a read operation, which will be described below.

During a read operation, a high voltage (e.g., a voltage of 3 V) is applied to the conductive layer 218 so that the same voltage can be applied to the main gate electrode 204 and to the sub gate electrode 210. A lower voltage (e.g., a voltage of 0.8-2 V) than the voltage applied to the conductive layer 218 is applied to the source and drain regions 212b in the area B. The source and drain regions 212a in the area A are grounded, or a lower voltage than the voltage applied to the source and drain regions 212b in the area A is applied to the source and drain regions 212a in the area A.

As described above, the electron trap area, which is formed in the nitride layer 216b during the program operation, varies the electric potential of the channel. Thus, it is possible to determine the type of data stored in the non-volatile memory device during the read operation based on the variation in the electric potential of the channel. Electrons trapped in the nitride layer 206b are prevented from leaking to the sub gate electrode 210 by the oxide layer 206.

An erase operation is performed through hot hole injection (HHI). Specifically, a negative voltage (e.g., a voltage of −6 to −12 V) is applied to the conductive layer 218 so that the same voltage can be applied to the main gate electrode 204 and to the sub gate electrode 210. The source and drain regions 212b in the area B and the semiconductor substrate 200 are grounded, while a positive voltage (e.g., a voltage of 4 to 7 V) is applied to the source and drain regions 212a in the area A.

Accordingly, holes are injected into the nitride layer 206b and then coupled with the electrons trapped in the nitride layer 206b. Then, the entire erase operation is completed.

The erase operation may also be performed through Fowler-Nordheim (FN) tunnelling. Specifically, a negative voltage (e.g., a voltage of −12 to −16 V) is applied to the conductive layer 218, and a positive voltage (e.g., a voltage of 4 to 7 V) is applied to the source and drain regions 212a and 212b and the semiconductor substrate 200.

As a result, holes are injected into the nitride layer 206b and then coupled with the electrons trapped in the nitride layer 206b. Thus, the entire erase operation is completed. In particular, FN tunnelling is very useful for erasing electrons programmed in both of the areas A and B.

The role of the metallic layer 208 in the erase operation will be described below. During the erase operation, a negative voltage (e.g., −6 to −12 V) is applied to the conductive layer 218 so that the same voltage can be applied to the main gate electrode 204 and to the sub gate electrode 210. Thus, holes in the semiconductor substrate 200 are attracted to the electron trap area in the nitride layer 206b. Since the holes have energy high enough to exceed a potential barrier of the oxide layer 206c, they tunnel through the oxide layer 206c. Thereafter, the holes are trapped in the nitride layer 206b and then coupled with electrons in the electron trap area.

If the metallic layer 208 having a higher work function than the material of the sub gate electrode 210, i.e., polysilicon, does not exist between the oxide layer 206a and the sub gate electrode 210, electrons supplied to the sub gate electrode 210 via the conductive layer 218 are likely to tunnel through the oxide layer 206a and be injected into the nitride layer 206b even though the oxide layer 206a is provided between the sub gate electrode 210 and the nitride layer 206b as an electron shield layer. At the same time, holes are drawn from the semiconductor substrate 200 to the nitride layer 206b. In short, electrons and holes are simultaneously injected into the nitride layer 206b, in which case, the electrons already trapped in the nitride layer 206b may not be easily removed, thus degrading the entire erase operation.

However, in the present embodiment, the metallic layer 208 is formed of a material having a higher work function than polysilicon between the oxide layer 206a and the sub gate electrode 210. Thus, a higher energy barrier is formed at the interface between the metallic layer 208 and the oxide layer 206a than in a non-volatile memory device where no metallic layer is formed between an oxide layer and a sub gate electrode. Therefore, electrons supplied to the sub gate electrode 210 from a negative power source are less likely to tunnel through the oxide layer 206c. Accordingly, during the erase operation, only holes are drawn from the semiconductor substrate 200 to the nitride layer 206b and then easily coupled with the electrons already trapped in the nitride layer 206b, thus enhancing the efficiency of the erase operation.

The program, read, and erase operations have been described so far mainly focusing on an occasion when they are performed in the area A. During the program, read, and erase operations, two usable bits are obtained from the area A (or the area B), which is known to those of ordinary skill in the art.

However, during the program operation, two or more bits may be usable for the area A (or the area B) because the amount of electric charge formed in the nitride layer 206b by injecting electrons into the nitride layer 206b can be controlled by controlling the time required for programming the non-volatile memory device (hereinafter referred to as program time).

For example, if three levels of voltages, i.e., a low voltage, a medium voltage, and a high voltage, can be formed by adjusting the amount of electric charge formed in the nitride layer 206b, eight bits are usable for the area A (or the area B). Specifically, the erase voltage, the middle voltage, and the high voltage may be set to, for example, 0 V, 2 V, and 4 V, respectively. The amount of electric charge formed in the nitride layer 206b may also be adjusted in the area B.

Accordingly, it is possible to increase the memory density of the non-volatile memory device without increasing the area of each cell of the non-volatile memory device.

A method of fabricating a non-volatile memory device according to an exemplary embodiment of the present invention will be described below with reference to FIGS. 5 through 7.

Figure 5:
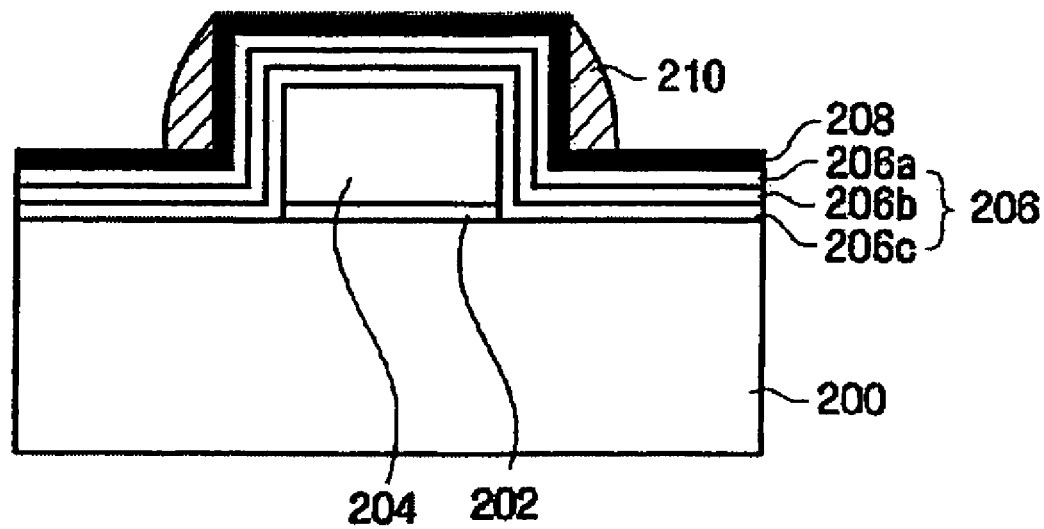
FIGS. 5 through 7 are cross-sectional views illustrating a method of fabricating the non-volatile memory device of FIG. 4, according to an exemplary embodiment of the present invention.

Referring to FIG. 5, an active region is defined on a semiconductor substrate 200 through a typical isolation operation, such as local oxidation of silicon (LOCOS) or shallow trench isolation (STI).

Thereafter, a first layer, which is to be a gate insulation layer 202, and a second layer, which is to be a main gate electrode 204, are sequentially grown on the entire surface of the active region of the semiconductor substrate 200. The second layer is grown to a thickness of about 1500 Å through a chemical vapor deposition (CVD) process. During the CVD process, impurities such as phosphor are implanted into the second layer, thereby reducing the electric resistance of the second layer.

Alternatively, the impurities may be implanted into the second layer through ion implantation after the second layer is fully grown on the entire surface of the active region of the semiconductor substrate 200.

The gate insulation layer 202 may be composed of, but is not restricted to, an oxide layer which is formed by depositing middle temperature oxide (MTO) on the semiconductor substrate 200 and performing an $N_2O$ annealing operation. The gate insulation layer 202 may be formed of silicon dioxide, oxynitride silicon, or aluminium oxide. Preferably, but not necessarily, the main gate electrode 204 is formed of polysilicon (poly-Si).

Alternatively, the main gate electrode 204 may be formed of silicon germanium (SiGe) or germanium (Ge). The semiconductor substrate 200 is patterned through typical photolithography and dry etching processes, thereby obtaining a gate pattern in which the gate insulation layer 202 and the sub gate electrode 210 are sequentially stacked.

Thereafter, an oxide layer 206c, a nitride layer 206b, and an oxide layer 206a, which will serve as an electron tunnelling layer, a charge trapping layer, and an electron shield layer, respectively, are sequentially deposited on the semiconductor substrate 200. Thereafter, a metal having a higher work function than polysilicon is deposited on the semiconductor substrate 200, thereby forming a metallic layer 208.

The oxide layer 206c may be replaced with a composite layer composed of nitride, nitrogen oxide, a high dielectric (high-k) material, or any combination thereof. Examples of the high dielectric material include aluminium oxide, zirconium oxide, hafnium oxide, and lanthanum oxide.

In addition, in order to enhance the charge shield and bake retention capabilities of the oxide layer 206c, the oxide layer 206c may be a composite layer formed by sequentially stacking thermal oxide and MTO and annealing them in an $N_2O$ atmosphere or may be a composite layer formed by sequentially stacking thermal oxide, SiON, MTO, SiON, and MTO and annealing them in an $N_2O$ atmosphere.

The oxide layer 206a may be a material layer formed of a high dielectric material, such as aluminium oxide, zirconium oxide, hafnium, lanthanum oxide, or any combination thereof.

The nitride layer 206b may be replaced with a material layer formed of a high dielectric material, such as aluminium oxide, zirconium oxide, hafnium, lanthanum oxide, nitrogen oxide, silicon dioxide, or any combination thereof. In a case where the nitride layer 206b is replaced with a material layer formed of aluminium oxide, zirconium oxide, hafnium, lanthanum oxide, nitrogen oxide, silicon dioxide, or any combination thereof, nitrogen is added to the material layer.

In addition, the nitride layer 206b may also be replaced with a composite layer in which a nitride layer and a material layer selected among high dielectric materials including aluminium oxide, zirconium oxide, hafnium, lanthanum oxide, nitride oxide, silicon dioxide, and a combination thereof, are stacked irrespective of order stacked, or may also be replaced with a composite layer in which at least two pairs of the nitride layer and the material layer are stacked.

The nitride layer 206b may also be replaced with a layer formed by stacking nitride and one of aluminium oxide, zirconium oxide, hafnium, lanthanum oxide, nitrogen oxide, and silicon dioxide in a sandwich form.

In addition, the nitride layer 206b may be composed of nitride dots, silicon dots, nano-crystal dots, metal nano-dots, or any combination thereof.

The metallic layer 208 may be formed of any metal having a higher work function than the material of the gate electrode 110. Preferably, but not necessarily, the metallic layer 108 is formed of a metal having a higher work function than polysilicon, such as TaN, NiTa, Ti, TiN, Ta, W, WN, Hf, Nb, Mo, $RuO_2$, $Mo_2N$, Ir, Pt, Co, Cr, RuO, or WNx.

A sub gate electrode 210 is formed at the sidewalls of the main gate electrode 204. Specifically, polysilicon is deposited on the entire surface of the semiconductor substrate 200 through a CVD process. During the CVD process, impurities, such as phosphor, are implanted into the polysilicon deposited on the entire surface of the semiconductor substrate 200, thereby reducing the electric resistance of the sub gate electrode 210.

The impurities may be implanted into the polysilicon deposited on the entire surface of the semiconductor substrate 200 through ion implantation after the second layer, which is to become the main gate electrode 204, is fully grown. Preferably, but not necessarily, the sub gate electrode 210 may be formed of polysilicon. Alternatively, the sub gate electrode 210 may be formed of silicon germanium (SiGe) or germanium (Ge).

Thereafter, the sub gate electrode 210 is formed as a spacer by performing an etching operation on the semiconductor substrate 200. Preferably, but not necessarily, the sub gate electrode 210 is formed using an etch-back operation because it is easy and less time-consuming to form the sub gate electrode 210 to a desired thickness through the etch-back operation. Since the thickness of the sub gate electrode 210 is controllable, the thickness of an L-shaped structure consisting of the oxide layer 206c, the nitride layer 206b, the oxide layer 206a, and the metallic layer 208 in a latitudinal direction is also controllable. This is a distinctive advantage of the non-volatile memory device according to the present invention, compared to a conventional non-volatile memory device having a local SONOS structure.

Therefore, it is possible to manufacture a non-volatile memory device having smaller cell size, more stable operating characteristics, and higher reliability, compared to a conventional non-volatile memory device.

Figure 6:
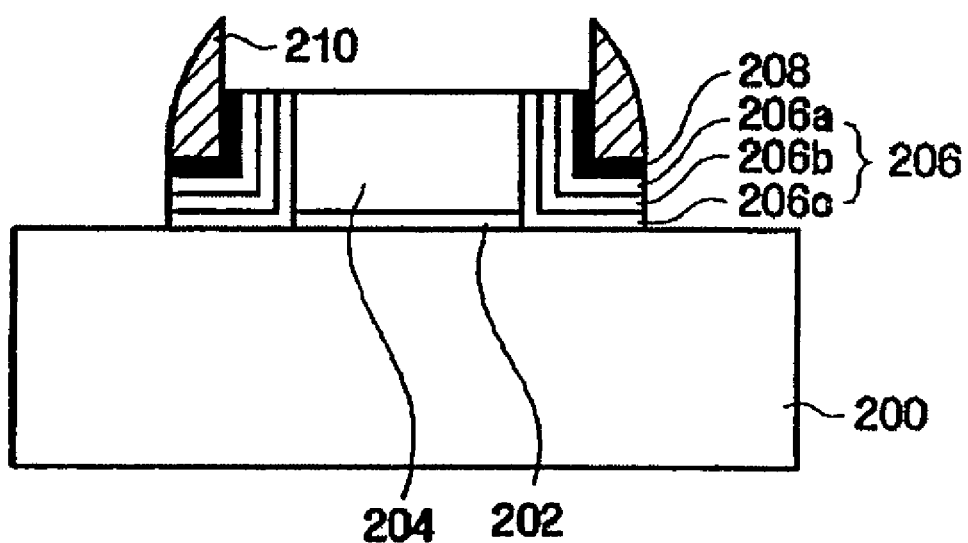

Referring to FIG. 6, an etching process is performed on the semiconductor substrate 200 using the sub gate electrode 210 as an etching mask until the top surface of the main gate electrode 204 is exposed.

Accordingly, portions of the oxide layer 206a, the nitride layer 206b, and the oxide layer 206c that are formed on the main gate electrode 204 are etched away, so that the top surface of the main gate electrode 204 is exposed. At the same time, portions of the oxide layer 206a, the nitride layer 206b, and the oxide layer 206c that are formed on the substrate 200 unmasked by the sub gate electrode 210 are etched away, so that the top surface of substrate 200 at the both side of that is exposed.

Figure 7:
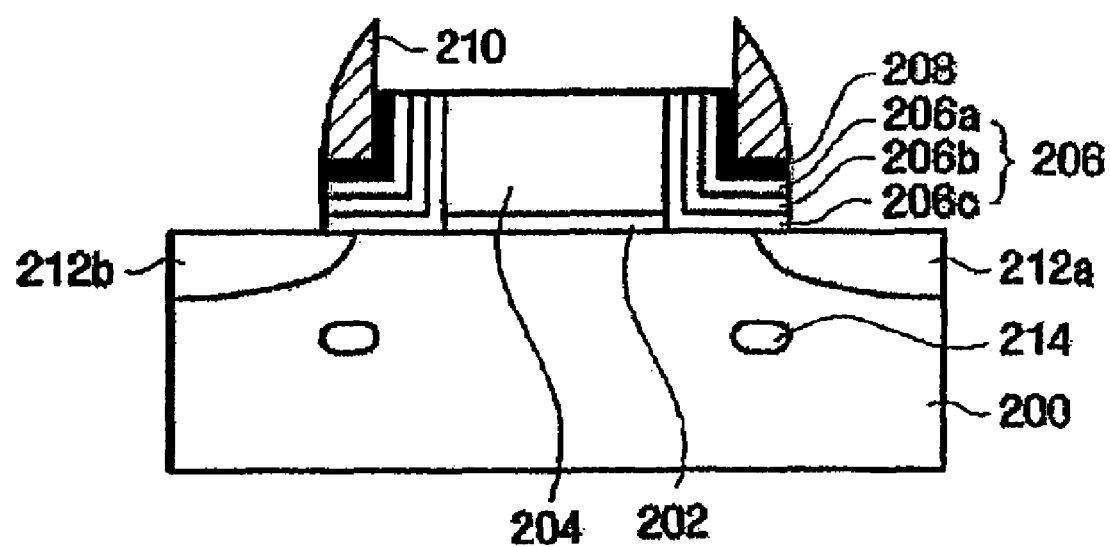

Referring to FIG. 7, source and drain regions 212a and 212b are formed in the semiconductor substrate 200 by implanting impurities of a polarization type opposite to that of the semiconductor substrate 200 into the semiconductor substrate 200.

The impurities may be phosphor (P) or arsenic (As). Thereafter, a halo ion implanted area 214 is formed below the source and drain regions 212a and 212b by pocket-implanting boron-based or indium-based ions into the source and drain regions 212a and 212b with a tilt angle of 0 to 45 degree.

The boron-based or indium-based ions should be of a polarization type opposite to that of the semiconductor substrate 200.

A halo ion injection process prevents depletion areas in source and drain regions from horizontally approaching each other, without affecting the doping concentration of a channel area, which determines the threshold voltage of a transistor. The halo ion injection process may be performed in the manufacture of a semiconductor device having a lightly doped drain (LDD) structure.

In the present embodiment, the halo ion injection process may be used to improve the program and erase efficiency of a non-volatile memory device.

Thereafter, in order to achieve a wiring structure of the non-volatile memory device of FIG. 4, an interlayer dielectric layer 216 (of FIG. 4) is first deposited on the semiconductor substrate 200 and then etched until the top surface of the main gate electrode 204 is exposed again.

Accordingly, an upper portion of the sub gate electrode 210 and the top surface of the main gate electrode 204 are exposed.

Thereafter, metal silicide (not shown) is formed on the main gate electrode 204 and on the sub gate electrode 210. Preferably, but not necessarily, the metal silicide may be formed of an alloy of at least one of cobalt (Co), nickel (Ni), titanium (Ti), and platinum (Pt) and another material. The metal silicide may be formed of any material that can be used to form metal silicide.

Thereafter, a conductive layer 218 (of FIG. 4), which is a wiring layer, is formed to cover the top surface of the main gate electrode 204 and the upper portion of the sub gate electrode 210, so that the main gate electrode 204 and the sub gate electrode 210 are electrically connected to another. Accordingly, the non-volatile memory device of FIG. 4 is completed.

In the present embodiment, the ONO structure 206 and the metallic layer 208 are formed on the sidewalls of the gate electrode 204. However, the ONO structure 206 and the metallic layer 208 may be formed on only one of the sidewalls of the main gate electrode 204 using an etching mask.

In addition, even though in the present embodiment the sub gate electrode 210 is formed at the sidewalls of the main gate electrode 204, and the source and drain regions 212a and 212b are respectively formed on both sides of the main gate electrode 204, one of the source and drain regions 212a and 212b may be formed to overlap a corresponding electron trap area.

In short, an electron trap area formed at only one side of the main gate electrode 204 may be used, in which case, a non-volatile memory device is programmed using a channel hot electron injection method and data is read from the non-volatile memory device using either a forward reading method or a reverse reading method.

A non-volatile memory device according to another exemplary embodiment of the present invention will be described below with reference to FIG. 8.

Figure 8:
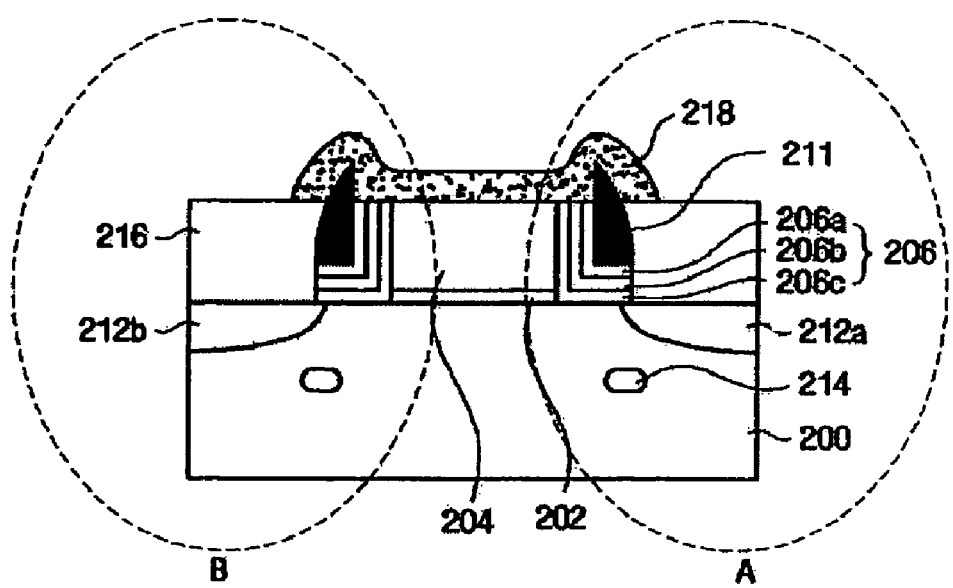
FIG. 8 is a cross-sectional view of a non-volatile memory device according to another exemplary embodiment of the present invention.

Since the non-volatile memory device of FIG. 8 is similar to the non-volatile memory device of FIG. 4, the following description will mainly focus on differences between the non-volatile memory device of FIG. 8 and the non-volatile memory device of FIG. 4. In the drawings, like reference numerals represent like elements.

In the previous embodiment, the metallic layer 208, which is formed of a metal having a higher work function than polysilicon, is interposed between the oxide layer. 206a and the sub gate electrode 210, which is formed of polysilcon, as illustrated in FIG. 4.

In the present embodiment, however, no metallic layer is interposed between an oxide layer 206a and a sub gate electrode 211, as shown in FIG. 8. Instead, the sub gate electrode 211 is formed of a metal having a higher work function than polysilicon.

Referring to FIG. 8, no metallic layer is formed between the oxide layer 206a, which serves as an electron shield layer, and the sub gate electrode 211. The sub gate electrode 211, unlike the sub gate electrode 210 of FIG. 4, is formed of a metal having a higher work function than polysilicon.

Specifically, source and drain regions 212a and 212b are formed in an active region through a typical isolation operation, such as STI. Thereafter, a gate insulation layer 202 and a main gate electrode 204 are sequentially formed on a semiconductor substrate 200, on which a halo ion-implanted area 214 is formed, through patterning. Next, an oxide layer 206c, a nitride layer 206b, and the oxide layer 206a are sequentially deposited on the semiconductor substrate 200 and on the sidewalls of the main gate electrode in an 'L' shape. Then, the sub gate electrode 211 in the form of a spacer is formed of a metal having a higher work function than polysilicon on the oxide layer 206a.

An interlayer dielectric layer 216 is formed on the entire surface of the semiconductor substrate 200 with the exception of portions of the semiconductor substrate 200 on which the main gate electrode 204, the sub gate electrode 211, and an ONO structure 206, consisting of the oxide layer 206a, the nitride layer 206b, and the oxide layer 206c, are formed.

Thereafter, a conductive layer 218 is formed on the semiconductor substrate 200 so that the main gate electrode 204 and the sub gate electrode 211 are electrically connected to each other.

The functions of the oxide layer 206c, the nitride layer 206b, and the oxide layer 206a are the same as the functions of their respective counterparts of FIG. 4. Specifically, the oxide layer 206c, the nitride layer 206b, and the oxide layer 206a serve as an electron tunnelling layer, a charge trapping layer, and an electron shield layer, respectively.

Program, read, and erase operations of the non-volatile memory device of FIG. 8 are the same as those of the non-volatile memory device of FIG. 4, and thus detailed descriptions thereof will not be repeated.

Since the sub gate electrode 211 is formed of a metal having a higher work function than polysilicon, an energy barrier formed at the interface between the sub gate electrode 211 and the oxide layer 206c is much higher than an energy barrier formed between a polysilicon sub gate electrode and an oxide layer of a conventional non-volatile memory device. Therefore, during an erase operation, electrons supplied to the sub gate electrode 211 from a negative power source are less likely to tunnel through an electron shield layer, i.e., the oxide layer 206c.

Figure 9:
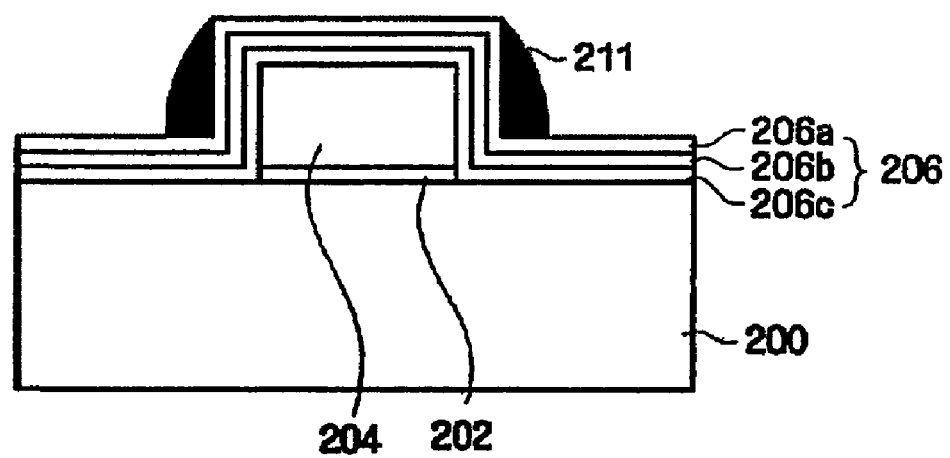
FIG. 9 through 11 are cross-sectional views illustrating a method of fabricating the non-volatile memory device of FIG. 8.
Figure 10:
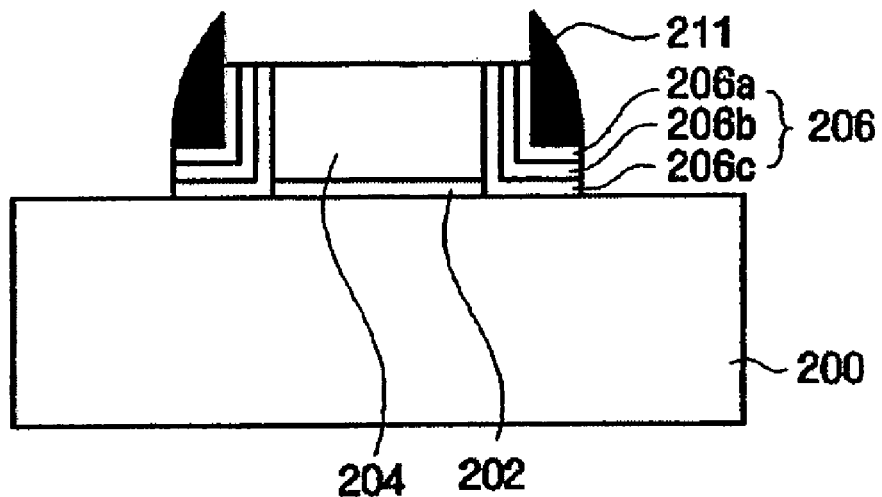
Figure 11:
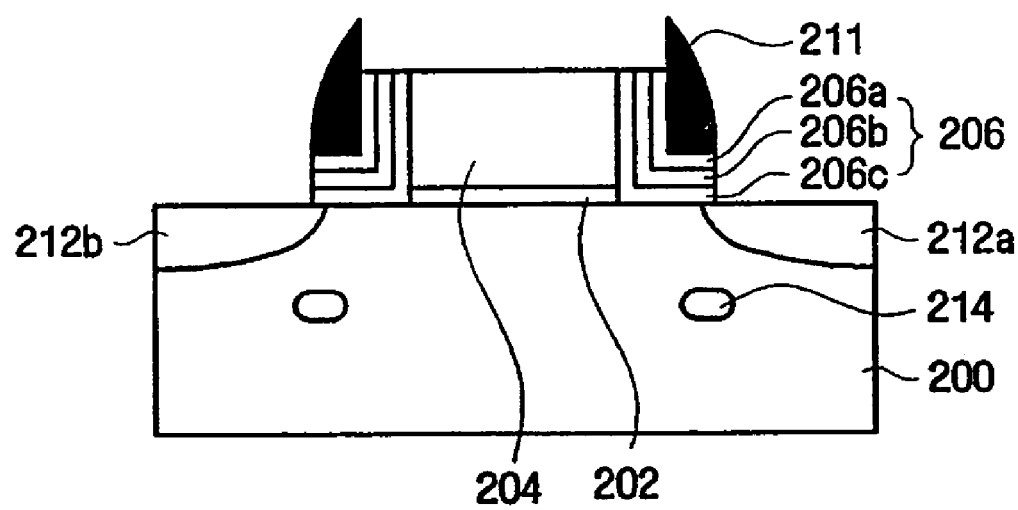

A method of fabricating a non-volatile memory device according to another exemplary embodiment of the present invention will now be described with reference to FIGS. 9 through 11.

Since the present embodiment is similar to the previous embodiment, the following description will mainly focus on differences between the present embodiment and the previous embodiment.

In the illustrative embodiment of the present embodiment, unlike in the previous embodiment, an ONO structure 206 consisting of an oxide layer 206c, a nitride layer 206b, and an oxide layer 206a is formed, and then a sub gate electrode 211 is formed without forming a metallic layer (208 of FIG. 4).

In the previous embodiment, metal silicide is formed on the top surface of the main gate electrode 204 and the upper portion of the gate electrode 210 before the conductive layer 218 is formed, as shown in FIG. 4.

However, in the present embodiment, the sub gate electrode 211 is formed of a metal, and thus, metal silicide is formed only on the top surface of a main gate electrode 204, as shown in FIG. 8.

Therefore, a typical silicide operation for forming metal silicide needs to be performed only on the top surface of the main gate electrode 204. During the typical silicide operation, the entire surface of a semiconductor substrate 200 with the exception of the top surface of the main gate electrode 204 is masked so that the typical silicide operation is performed only on the top surface of the main gate electrode 204.

Specifically, before forming a conductive layer 208, a predetermined material layer is grown on the entire surface of the semiconductor substrate, and then only the main gate electrode is opened by performing photolithography and etching processes on the predetermined material layer. Thereafter, a silicide process is performed on the semiconductor substrate 200. Then, the predetermined material layer remaining on the semiconductor substrate 200 is removed. Next, the conductive layer 218 is formed. Then, the non-volatile memory device of FIG. 8 is completed.

In the present embodiment, a process of forming silicide on the main gate electrode 204 may be skipped.

In the present embodiment, the sub gate electrode 211 serves the same functions as the metallic layer 208 of FIG. 4. Thus, the sub gate electrode 211 may be formed of the same material as the metallic layer 208.

As described above, according to the present invention, the program, read, and/or erase operation efficiency of a non-volatile memory device are enhanced. Memory density is increased without increasing memory area. Moreover, the reliability of the non-volatile memory device is enhanced.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. A non-volatile memory device comprising:
a gate electrode, which is formed on a semiconductor substrate on which source and drain regions are formed;
a trapping structure, which is interposed between the semiconductor substrate and the gate electrode and comprises an electron tunneling layer that is adjacent to the semiconductor substrate and a charge trapping layer that is adjacent to the electron tunneling layer; and
an electron back-tunneling prevention layer, which is adjacent to a bottom surface of the gate electrode and is interposed between the gate electrode and the charge trapping layer, wherein an electron flow path is formed between at least one of: (1) a region proximal to the source region, the electron tunneling layer, and the charge trapping layer, and (ii) a region proximal to the drain region, the electron tunneling layer, and the charge trapping layer, such that electrons are injected into the charge trapping layer, the electron back-tunneling prevention layer prevents electrons in the gate electrode from back-tunneling through the charge trapping layer, and wherein the electron back-tunneling prevention layer is formed of a metal having a higher work function than the gate electrode.

2. The non-volatile memory device of claim 1 further comprising an electron shield layer, which is interposed between the electron back-tunneling prevention layer and the charge trapping layer.

3. The non-volatile memory device of claim 1, wherein the metal is one selected from the group consisting of TaN, NiTa, Ti, TiN, Ta, W, WN, Hf, Nb, Mo, $RuO_2$, $Mo_2N$, Ir, Pt, Co, Cr, RuO, and $WN_x$.

4. The non-volatile memory device of claim 1, wherein the charge trapping layer is formed of nitride or a high dielectric material.

5. The non-volatile memory device of claim 4, wherein the high dielectric material is formed of a mixture of aluminum oxide, zirconium oxide, hafnium, lanthanum oxide, nitride oxide, silicon dioxide, or any combination thereof, and nitrogen.

6. The non-volatile memory device of claim 1, wherein the charge trapping layer is a stack formed of nitride and a high dielectric material selected from the group consisting of aluminum oxide, zirconium oxide, hafnium, lanthanum oxide, nitrogen oxide, and silicon dioxide, and the stack is a composite layer consisting of at least two pairs of nitride and the high dielectric material, or a composite layer consisting of the high dielectric material interposed between nitrides.

7. The non-volatile memory device of claim 1, wherein the charge trapping layer is formed of nitride dots, silicon dots, nano-crystal dots, metal nano-dots, or any combination thereof.

8. The non-volatile memory device of claim 1, wherein the electron tunneling layer is a composite layer consisting of oxide, nitride, nitrogen oxide, a high dielectric material, or any combination thereof, the electron shield layer is a stack formed of thermal oxide and middle temperature oxide (MTO) that are annealed in an $N_2O$ atmosphere, or a stack formed of thermal oxide, SiON, MTO, SiON, and MTO that are annealed in an $N_2O$ atmosphere.

9. The non-volatile memory device of claim 8, wherein the high dielectric material is formed of a mixture of aluminum oxide, zirconium oxide, hafnium, lanthanum oxide, nitride oxide, silicon dioxide, or any combination thereof, and nitrogen.

10. A non-volatile memory device comprising:
a gate insulation layer, which is formed on a semiconductor substrate on which source and drain regions are formed;
a main gate electrode, which is formed on the gate insulation layer;
a sub gate electrode, which is formed on sidewalls of the main gate electrode;
a trapping structure, which is interposed between the sub gate electrode and the semiconductor substrate and comprises an electron tunneling layer that is adjacent to the semiconductor substrate and a charge trapping layer that is adjacent to the electron tunneling layer; and
an electron back-tunneling prevention layer, which is adjacent to a bottom surface of the sub gate electrode and is interposed between the sub gate electrode and the charge trapping layer, wherein an electron flow path is formed between at least one of: (1) a region proximal to the source region, the electron tunneling layer, and the charge trapping layer, and (ii) a region proximal to the drain region, the electron tunneling layer, and the charge trapping layer, such that electrons are injected into the charge trapping layer, the electron back-tunneling prevention layer prevents electrons in the sub gate electrode from back-tunneling through the charge trapping layer, and wherein the electron back-tunneling prevention layer is formed of a metal having a higher work function than the sub gate electrode.

11. The non-volatile memory device of claim 10, further comprising an electron shield layer, which is interposed between the electron back-tunneling prevention layer and the charge trapping layer.

12. The non-volatile memory device of claim 10, further comprising a metal wiring layer, which electrically connects the main gate electrode and the sub gate electrode.

13. The non-volatile memory device of claim 10, wherein the metal is one selected from the group consisting of TaN, NiTa, Ti, TiN, Ta, W, WN, Hf, Nb, Mo, $RuO_2$, $Mo_2N$, Ir, Pt, Co, Cr, RuO, and $WN_x$.

14. The non-volatile memory device of claim 10, wherein the charge trapping layer is formed of nitride or a high dielectric material.

15. The non-volatile memory device of claim 14, wherein the high dielectric material is formed of a mixture of aluminum oxide, zirconium oxide, hafnium, lanthanum oxide, nitride oxide, silicon dioxide, or any combination thereof, and nitrogen.

16. The non-volatile memory device of claim 10, wherein the charge trapping layer is a stack formed of nitride and a high dielectric material selected from the group consisting of aluminum oxide, zirconium oxide, hafnium, lanthanum oxide, nitrogen oxide, and silicon dioxide, and the stack is a composite layer consisting of at least two pairs of nitride and the high dielectric material, or a composite layer consisting of the high dielectric material interposed between nitrides.

17. The non-volatile memory device of claim 10, wherein the charge trapping layer is formed of nitride dots, silicon dots, nano-crystal dots, metal nano-dots, or any combination thereof.

18. The non-volatile memory device of claim 10, wherein the electron tunneling layer is a composite layer consisting of oxide, nitride, nitrogen oxide, a high dielectric material, or any combination thereof, the electron shield layer is a stack formed of thermal oxide and middle temperature oxide (MTO) that are annealed in an $N_2O$ atmosphere, or a stack formed of thermal oxide, SiON, MTO, SiON, and MTO that are annealed in an $N_2O$ atmosphere.

19. The non-volatile memory device of claim 18, wherein the high dielectric material is formed of a mixture of aluminum, oxide, zirconium oxide, hafnium, lanthanum oxide, nitride oxide, silicon dioxide, or any combination thereof, and nitrogen.

20. A non-volatile memory device comprising:
a gate electrode, which is formed on a semiconductor substrate on which source and drain regions are formed;
a trapping structure, which is interposed between the semiconductor substrate and the gate electrode and comprises an electron tunneling layer that is adjacent to the semiconductor substrate and a charge trapping layer that is adjacent to the electron tunneling layer, wherein the charge trapping layer is formed of nitride or a high dielectric material, wherein the high dielectric material is formed of a mixture of aluminum oxide, zirconium oxide, hafnium, lanthanum oxide, nitride oxide, silicon dioxide, or any combination thereof, and nitrogen; and
an electron back-tunneling prevention layer adjacent to a bottom surface of the gate electrode, which is interposed between the gate electrode and the charge trapping layer, wherein an electron flow path is formed between at least one of: (1) a region proximal to the source region, the electron tunneling layer, and the charge trapping layer, and (ii) a region proximal to the drain region, the electron tunneling layer, and the charge trapping layer, such that electrons are injected into the charge trapping layer, the electron back-tunneling prevention layer prevents electrons in the gate electrode from back-tunneling through the charge trapping layer, and wherein the electron back-tunneling prevention layer is formed of a metal having a higher work function than the gate electrode.

21. A non-volatile memory device comprising:
a gate electrode, which is formed on a semiconductor substrate on which source and drain regions are formed;
a trapping structure, which is interposed between the semiconductor substrate and the gate electrode and comprises an electron tunneling layer and a charge trapping layer, wherein the charge trapping layer is a stack formed of nitride and a high dielectric material selected from the group consisting of aluminum oxide, zirconium oxide, hafnium, lanthanum oxide, nitrogen oxide, and silicon dioxide, and the stack is a composite layer consisting of at least two pairs of nitride and the high dielectric material, or a composite layer consisting of the high dielectric material interposed between nitrides; and
an electron back-tunneling prevention layer, which is interposed between the gate electrode and the charge trapping layer, prevents electrons in the gate electrode from back-tunneling through the charge trapping layer, and is formed of a metal having a higher work function than the gate electrode.

22. A non-volatile memory device comprising:
a gate electrode, which is formed on a semiconductor substrate on which source and drain regions are formed;
a trapping structure, which is interposed between the semiconductor substrate and the gate electrode and comprises an electron tunneling layer and a charge trapping layer, wherein the electron tunneling layer is a composite layer consisting of oxide, nitride, nitrogen oxide, a high dielectric material, or any combination thereof, the electron shield layer is a stack formed of thermal oxide and middle temperature oxide (MTO) that are annealed in an $N_2O$ atmosphere, or a stack formed of thermal oxide, SiON, MTO, SiON, and MTO that are annealed in an $N_2O$ atmosphere; and
an electron back-tunneling prevention layer, which is interposed between the gate electrode and the charge trapping layer, prevents electrons in the gate electrode from back-tunneling through the charge trapping layer, and is formed of a metal having a higher work function than the gate electrode.

23. The non-volatile memory device of claim 22, wherein the high dielectric material is formed of a mixture of aluminum oxide, zirconium oxide, hafnium, lanthanum oxide, nitride oxide, silicon dioxide, or any combination thereof, and nitrogen.

24. A non-volatile memory device comprising:
a gate insulation layer, which is formed on a semiconductor substrate on which source and drain regions are formed;

a main gate electrode, which is formed on the gate insulation layer;

a sub gate electrode, which is formed on sidewalls of the main gate electrode;

a trapping structure, which is interposed between the sub gate electrode and the semiconductor substrate and comprises an electron tunneling layer that is adjacent to the semiconductor substrate and a charge trapping layer that is adjacent to the electron tunneling layer, wherein the charge trapping layer is formed of nitride or a high dielectric material, and wherein the high dielectric material is formed of a mixture of aluminum oxide, zirconium oxide, hafnium, lanthanum oxide, nitride oxide, silicon dioxide, or any combination thereof, and nitrogen; and an electron back-tunneling prevention layer, which is adjacent to a bottom surface of the gate electrode and is interposed between the sub gate electrode and the charge trapping layer, wherein an electron flow path is formed between at least one of: (1) a region proximal to the source region, the electron tunneling layer, and the charge trapping layer, and (ii) a region proximal to the drain region, the electron tunneling layer, and the charge trapping layer, such that electrons are injected into the charge trapping layer, the electron back-tunneling prevention layer prevents electrons in the gate electrode from back-tunneling through the charge trapping layer, and wherein the electron back-tunneling prevention layer is formed of a metal having a higher work function than the gate electrode.

25. A non-volatile memory device comprising:

a gate insulation layer, which is formed on a semiconductor substrate on which source and drain regions are formed;

a main gate electrode, which is formed on the gate insulation layer;

a sub gate electrode, which is formed on sidewalls of the main gate electrode;

a trapping structure, which is interposed between the sub gate electrode and the semiconductor substrate and comprises an electron tunneling layer and a charge trapping layer, wherein the charge trapping layer is a stack formed of nitride and a high dielectric material selected from the group consisting of aluminum oxide, zirconium oxide, hafnium, lanthanum oxide, nitrogen oxide, and silicon dioxide, and the stack is a composite layer consisting of at least two pairs of nitride and the high dielectric material, or a composite layer consisting of the high dielectric material interposed between nitrides; and an electron back-tunneling prevention layer, which is interposed between the gate electrode and the charge trapping layer, prevents electrons in the sub gate electrode from back-tunneling through the charge trapping layer, and is formed of a metal having a higher work function than the sub gate electrode.

26. A non-volatile memory device comprising:

a gate insulation layer, which is formed on a semiconductor substrate on which source and drain regions are formed;

a main gate electrode, which is formed on the gate insulation layer;

a sub gate electrode, which is formed on sidewalls of the main gate electrode;

a trapping structure, which is interposed between the sub gate electrode and the semiconductor substrate and comprises an electron tunneling layer and a charge trapping layer, wherein the electron tunneling layer is a composite layer consisting of oxide, nitride, nitrogen oxide, a high dielectric material, or any combination thereof, the electron shield layer is a stack formed of thermal oxide and middle temperature oxide (MTO) that are annealed in an $N_2O$ atmosphere, or a stack formed of thermal oxide, SiON, MTO, SiON, and MTO that are annealed in an $N_2O$ atmosphere; and an electron back-tunneling prevention layer, which is interposed between the gate electrode and the charge trapping layer, prevents electrons in the sub gate electrode from back-tunneling through the charge trapping layer, and is formed of a metal having a higher work function than the sub gate electrode.

27. The non-volatile memory device of claim 26, wherein the high dielectric material is formed of a mixture of aluminum oxide, zirconium oxide, hafnium, lanthanum oxide, nitride oxide, silicon dioxide, or any combination thereof, and nitrogen.

28. A non-volatile memory device comprising:

a trapping structure, which is formed on a semiconductor substrate on which source and drain regions are formed and comprises an electron tunneling layer and a charge trapping layer, wherein the charge trapping layer is formed of a mixture of aluminum oxide, zirconium oxide, hafnium, lanthanum oxide, nitride oxide, silicon dioxide, or any combination thereof, and nitrogen; and a gate electrode, which is formed on the trapping structure and is formed of a metal that prevents electrons injected thereinto from back-tunneling through the charge trapping layer.

29. A non-volatile memory device comprising:

a trapping structure, which is formed on a semiconductor substrate on which source and drain regions are formed and comprises an electron tunneling layer and a charge trapping layer, wherein the charge trapping layer is a stack formed of nitride and a high dielectric material selected from the group consisting of aluminum oxide, zirconium oxide, hafnium, lanthanum oxide, nitrogen oxide, and silicon dioxide, and the stack is a composite layer consisting of at least two pairs of nitride and the high dielectric material, or a composite layer consisting of the high dielectric material interposed between nitrides; and a gate electrode, which is formed on the trapping structure and is formed of a metal that prevents electrons injected thereinto from back-tunneling through the charge trapping layer.

30. A non-volatile memory device comprising:

a trapping structure, which is formed on a semiconductor substrate on which source and drain regions are formed and comprises an electron tunneling layer and a charge trapping layer, wherein the electron tunneling layer is a composite layer consisting of oxide, nitride, nitrogen oxide, a high dielectric material, or any combination thereof, the electron shield layer is a stack formed of thermal oxide and middle temperature oxide (MTO) that are annealed in an $N_2O$ atmosphere, or a stack formed of thermal oxide, SiON, MTO, SiON, and MTO that are annealed in an $N_2O$ atmosphere; and a gate electrode, which is formed on the trapping structure and is formed of a metal that prevents electrons injected thereinto from back-tunneling through the charge trapping layer.

31. The non-volatile memory device of claim 30, wherein the high dielectric material is formed of a mixture of aluminum oxide, zirconium oxide, hafnium, lanthanum oxide, nitride oxide, silicon dioxide, or any combination thereof, and nitrogen.

32. A non-volatile memory device comprising:
a gate insulation layer, which is formed on a semiconductor substrate where source and drain regions are formed;
a main gate electrode, which is formed on the gate insulation layer;
a trapping structure, which is formed on sidewalls of the main gate electrode and comprises an electron tunneling layer and a charge trapping layer, wherein the charge trapping layer is formed of a mixture of aluminum oxide, zirconium oxide, hafnium, lanthanum oxide, nitride oxide, silicon dioxide, or any combination thereof, and nitrogen; and
a sub gate electrode formed on the trapping structure, wherein the sub gate electrode is formed of metal that prevents electrons therein from back-tunneling to the charge trapping layer.

33. A non-volatile memory device comprising:
a gate insulation layer, which is formed on a semiconductor substrate where source and drain regions are formed;
a main gate electrode, which is formed on the gate insulation layer;
a trapping structure, which is formed on sidewalls of the main gate electrode and comprises an electron tunneling layer and a charge trapping layer, wherein the charge trapping layer is a stack formed of nitride and a high dielectric material selected from the group consisting of aluminum oxide, zirconium oxide, hafnium, lanthanum oxide, nitrogen oxide, and silicon dioxide, and the stack is a composite layer consisting of at least two pairs of nitride and the high dielectric material, or a composite layer consisting of the high dielectric material interposed between nitrides; and
a sub gate electrode formed on the trapping structure, wherein the sub gate electrode is formed of metal that prevents electrons therein from back-tunneling to the charge trapping layer.

34. A non-volatile memory device comprising:
a gate insulation layer, which is formed on a semiconductor substrate where source and drain regions are formed;
a main gate electrode, which is formed on the gate insulation layer;
a trapping structure, which is formed on sidewalls of the main gate electrode and comprises an electron tunneling layer and a charge trapping layer, wherein the electron tunneling layer is a composite layer consisting of oxide, nitride, nitrogen oxide, a high dielectric material, or any combination thereof, the electron shield layer is a stack formed of thermal oxide and middle temperature oxide (MTO) that are annealed in an $N_2O$ atmosphere, or a stack formed of thermal oxide, SiON, MTO, SiON, and MTO that are annealed in an $N_2O$ atmosphere; and
a sub gate electrode formed on the trapping structure, wherein the sub gate electrode is formed of metal that prevents electrons therein from back-tunneling to the charge trapping layer.

35. The non-volatile memory device of claim 34, wherein the high dielectric material is formed of a mixture of aluminum oxide, zirconium oxide, hafnium, lanthanum oxide, nitride oxide, silicon dioxide, or any combination thereof, and nitrogen.

* * * * *

UNITED STATES PATENT AND TRADEMARK OFFICE
CERTIFICATE OF CORRECTION

| | | |
|---|---|---|
| PATENT NO. | : 7,473,961 B2 | Page 1 of 1 |
| APPLICATION NO. | : 11/183614 | |
| DATED | : January 6, 2009 | |
| INVENTOR(S) | : Ki-chul Kim et al. | |

It is certified that error appears in the above-identified patent and that said Letters Patent is hereby corrected as shown below:

Column 15, lines 54 and 55 between "aluminum" and "oxide" delete ","

Signed and Sealed this

Twenty-eighth Day of April, 2009

JOHN DOLL
*Acting Director of the United States Patent and Trademark Office*